(12) United States Patent
Strutt et al.

(10) Patent No.: US 11,502,254 B2
(45) Date of Patent: Nov. 15, 2022

(54) RESISTIVE RANDOM ACCESS MEMORY DEVICE AND METHODS OF FABRICATION

(71) Applicant: Intel Corporation, Santa Clara, CA (US)

(72) Inventors: Nathan Strutt, Beaverton, OR (US); Albert Chen, Portland, OR (US); Oleg Golonzka, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 899 days.

(21) Appl. No.: 16/147,199

(22) Filed: Sep. 28, 2018

(65) Prior Publication Data
US 2020/0106013 A1  Apr. 2, 2020

(51) Int. Cl.
*H01L 45/00* (2006.01)
*H01L 27/24* (2006.01)

(52) U.S. Cl.
CPC ...... *H01L 45/1641* (2013.01); *H01L 27/2436* (2013.01); *H01L 27/2463* (2013.01); *H01L 45/08* (2013.01); *H01L 45/1233* (2013.01); *H01L 45/1253* (2013.01); *H01L 45/146* (2013.01); *H01L 45/1616* (2013.01); *H01L 45/1625* (2013.01); *H01L 45/1675* (2013.01)

(58) Field of Classification Search
CPC ..................... H01L 45/1233; H01L 45/146
See application file for complete search history.

(56) References Cited

U.S. PATENT DOCUMENTS

| | | | |
|---|---|---|---|
| 9,640,586 B2 * | 5/2017 | Seong | H01L 45/147 |
| 10,490,738 B2 * | 11/2019 | Govoreanu | G11C 13/0069 |
| 10,593,877 B2 * | 3/2020 | Chen | H01L 45/12 |

* cited by examiner

*Primary Examiner* — Mark V Prenty
(74) *Attorney, Agent, or Firm* — Essential Patents Group, LLP

(57) ABSTRACT

A memory device structure includes a first electrode, a second electrode, a switching layer between the first electrode and the second electrode, where the switching layer is to transition between first and second resistive states at a voltage threshold. The memory device further includes an oxygen exchange layer between the switching layer and the second electrode, where the oxygen exchange layer includes a metal and a sidewall oxide in contact with a sidewall of the oxygen exchange layer. The sidewall oxide includes the metal of the oxygen exchange layer and oxygen, and has a lateral thickness that exceed a thickness of the switching layer.

20 Claims, 12 Drawing Sheets

200

```
┌─────────────────────────────────────────────┐
│  Form a first conductive layer above a substrate │
│                     210                     │
└─────────────────────────────────────────────┘
                      │
                      ▼
┌─────────────────────────────────────────────┐
│  Form an oxide layer layer above the first layer │
│                     220                     │
└─────────────────────────────────────────────┘
                      │
                      ▼
┌─────────────────────────────────────────────┐
│  Form a second conductive layer above the oxide layer │
│                     230                     │
└─────────────────────────────────────────────┘
                      │
                      ▼
┌─────────────────────────────────────────────┐
│  Form a third conductive layer above the second conductive layer │
│                     240                     │
└─────────────────────────────────────────────┘
                      │
                      ▼
┌─────────────────────────────────────────────┐
│  Pattern the third conducive layer, the second conductive layer, the oxide layer │
│                     250                     │
└─────────────────────────────────────────────┘
                      │
                      ▼
┌─────────────────────────────────────────────┐
│  Oxidize the sidewall of the second conductive layer │
│                     260                     │
└─────────────────────────────────────────────┘
                      │
                      ▼
┌─────────────────────────────────────────────┐
│         Pattern the first conductive layer         │
│                     270                     │
└─────────────────────────────────────────────┘
```

FIG. 2

RESISTIVE RANDOM ACCESS MEMORY DEVICE AND METHODS OF FABRICATION

BACKGROUND

For the past several decades, feature size reduction has been a key focus for industrial-scale semiconductor process development. Scaling to smaller dimensions enables a higher density of functional elements per chip, smaller chips, and also reduced cost. However, as the industry approaches the physical limits of traditional scaling, it is becoming increasingly important to look for non-traditional types of devices that can offer new functionality. One such example is non-volatile memory based on resistive random-access memory (RRAM) devices.

Non-volatile on-chip embedded memory with resistive random-access memory (RRAM) devices can improve energy and computational efficiency of a system on chip (SOC). However, technical challenges of creating an appropriate stack for fabrication of RRAM devices with high device endurance, high retention and operate at low voltages and currents present formidable roadblocks to commercialization of this technology. Specifically, the objective of memory technology to control tail bit data in a large array of memory bits necessitates tighter control of the variations in switching layer break down and switching events in individual bits. Furthermore, in filamentary RRAM systems, the former relies on engineering an oxygen exchange layer that results in lower break down voltages and high device endurance. As such, significant improvements are still needed in material layer stacks for RRAM devices which rely on material advancements, fabrication techniques, or a combination of both.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 2 illustrates a flow chart for a method to fabricate an RRAM device, in accordance with an embodiment of the present disclosure.

DESCRIPTION OF EMBODIMENTS

Figure 1A:
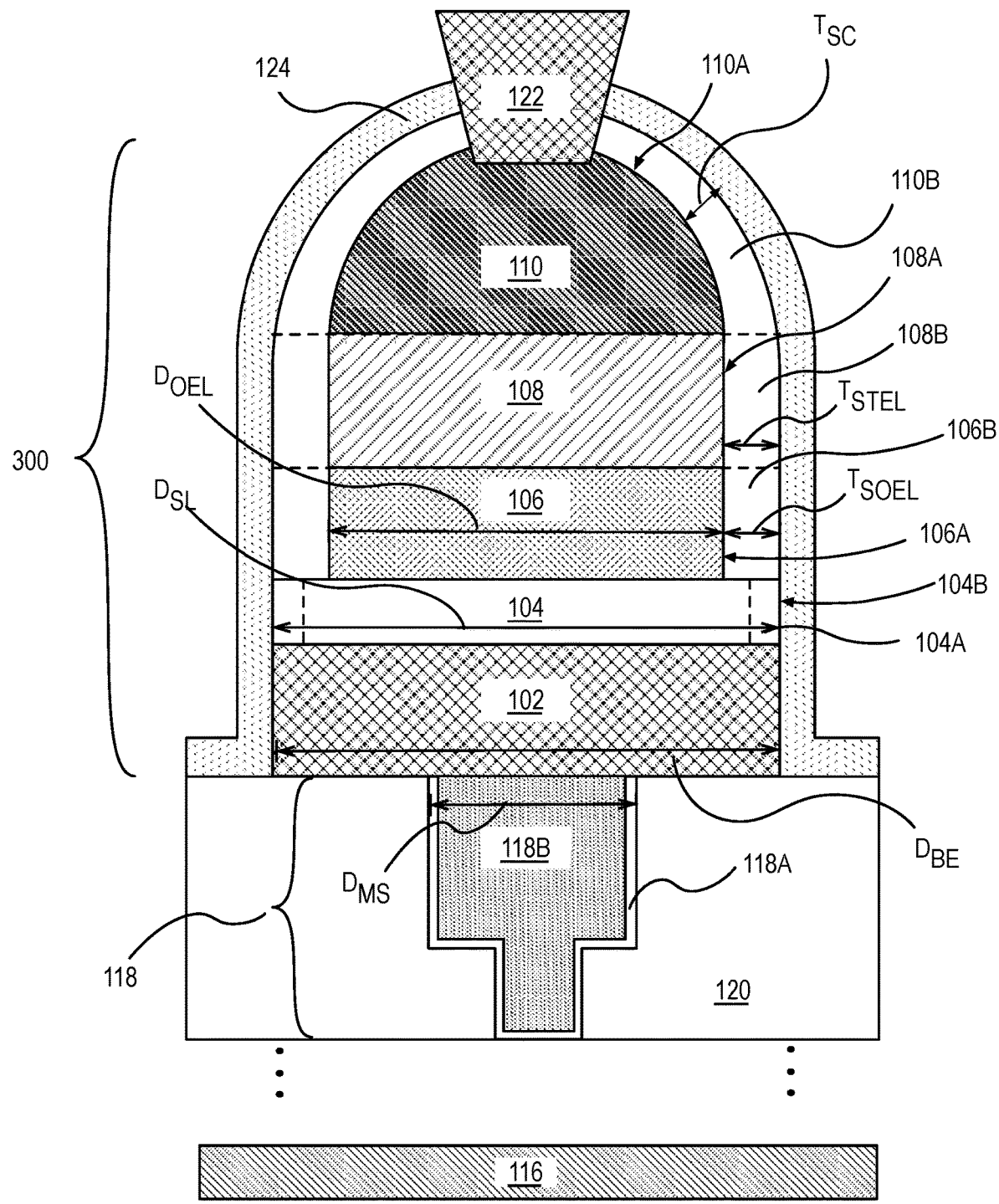
FIG. 1A illustrates a cross-sectional view of a RRAM device including a sidewall oxide, in accordance with an embodiment of the present disclosure.

A switching multi-layer stack for a resistive random-access memory (RRAM) device and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

Integration of a memory array including RRAM devices with low voltage logic circuitry, such as logic circuitry operational at a voltage less than or approximately equal to 1 Volt, may be advantageous since it enables higher operation speeds compared to having physically separate logic and memory chips. However, approaches to integrating an RRAM device with a component of logic circuitry, such as a transistor, to create embedded memory presents material challenges that have become far more formidable with scaling. As transistor operating voltages are scaled down, RRAM memory devices that are connected in series with such transistors are also required to function at lower voltages and currents.

Non-volatile memory devices, such as resistive random-access memory (RRAM) devices, depend on a phenomenon of resistance switching to store information. The non-volatile memory device functions as a variable resistor where the resistance of the device may switch between a high resistance state and a low resistance state. Resistance switching relies on a change in conductivity of the RRAM device. In particular, a switching layer within the RRAM device determines the conductivity of the RRAM device. In one RRAM device embodiment, the conductivity is modulated by formation and dissolution of a conductive filament in the switching layer.

The conductive filament may be created in an RRAM device by a one-time electro-forming process, where a voltage is applied between two electrodes located on either side of the switching layer. The electro-forming process may cause an electrical breakdown within the switching layer leading to a formation of the conductive filament. The electro-forming voltage depends on the material composition, thickness and quality of the switching layer and can dictate a size of the conductive filament being formed within the switching layer. A low electro-forming voltage is desirable as it creates a conductive filament that supports low current operation (i.e. switching or cycling an RRAM device between a high and a low resistance state). A low current operation is desirable from a power savings perspective. In some embodiments, the electro-forming voltage may be reduced by inserting an oxygen exchange layer between the switching layer and one of the two electrodes. The oxygen exchange layer may be a metal that acts as a source or sink of oxygen vacancies.

However, during the fabrication process, sidewall portions of the switching layer and the oxygen exchange layer of RRAM devices may become damaged, for example by a plasma etching process. The inventors have found that while low electro-forming voltages can be applied to form conductive filaments in these RRAM devices, the RRAM devices themselves suffer from retention failures. An exemplary retention failure is a drifting of the resistance level of a single RRAM device from a programmed low resistance level to a level above a predetermined reference level over a 24-hour time period. Although not bound by theory, the inventors believe that filaments may form near damaged sidewall portions of both the switching layer and oxygen exchange layer, and such filaments may contribute to retention failure in the memory device. These filaments formed during the electro-forming process may diminish in size when left alone over time (for e.g., 24 hours) leading to an increase in the low resistance level of the RRAM device.

Increasing the size of the conductive filament formed during the electro-forming process may have a mitigating effect. However, during resistance switching, a large conductive filament may require a larger electrical current to dissolve and re-form than a relatively smaller conductive filament. For an RRAM device that is coupled to a transistor, such as for embedded memory, a low current operation (small conductive filament) is desirable. A maximum current delivered by the transistor to the RRAM device may not meet the threshold current requirement for filament formation and dissolution if the conductive filament formed during the electro-forming process becomes too large in size. In examples, where transistor threshold current is not a limitation, increasing filament size may lead to endurance problems. Endurance relates to the number of switching cycles that an RRAM device can complete before becoming fixed in the high resistance state.

The inventors have found that RRAM device drift from a programmed low resistance level may be addressed without increasing the electro-forming voltage to increase filament size. Specifically, the use of one or more plasma oxidation processes during select patterning portions of the RRAM device fabrication process may oxidize portions of the sidewall of the oxygen exchange layer and anneal portions of the damaged switching layer in the RRAM device. Oxidation of the sidewall portions of the oxygen exchange layer may also limit the formation of conductive filaments near the device sidewall during device operation.

In accordance with an embodiment of the present disclosure, an RRAM device structure includes a first electrode, a second electrode above the first electrode, a switching layer between the first electrode and the second electrode, where the switching layer is to transition between a first and a second resistive state at a threshold voltage after a one time electro-forming process. The RRAM device structure further includes an oxygen exchange layer between the switching layer and the second electrode, and a sidewall oxide in contact with a sidewall of the oxygen exchange layer. In an embodiment, the oxygen exchange layer includes a metal, and the sidewall oxide includes the metal of the oxygen exchange layer and oxygen. The sidewall oxide may be formed by a plasma oxidation process after a partial patterning process, for example. In some embodiments, the sidewall oxide has a lateral thickness exceeding a vertical thickness of the switching layer. In other embodiments, the sidewall oxide includes the metal of the oxygen exchange layer and traces of elements present in the switching layer, and/or traces of elements present in the first and second electrodes.

In other embodiments, the oxygen exchange layer includes a first metal and the second electrode includes a second metal. In some such embodiments, the plasma oxidation process also forms a sidewall oxide adjacent to the second electrode. The second sidewall oxide may be contiguous with the first sidewall oxide. When the oxygen exchange layer and the second electrode both include a same metal, the sidewall oxides formed on the respective layers may have a same lateral thickness and be compositionally indistinguishable.

FIG. 1A illustrates a cross-sectional illustration of a memory device structure such as an RRAM device 100A. As shown the RRAM device 100A includes a first electrode or a bottom electrode 102 and a second electrode or a top electrode 108 above the bottom electrode 102. The RRAM device 100A further includes a switching layer 104 between the bottom electrode 102 and the top electrode 108. An oxygen exchange layer 106 including a metal is between the switching layer 104 and the top electrode 108, as shown. The RRAM device 100A also includes a sidewall oxide 106B in contact with an oxygen exchange layer sidewall 106A. In the illustrative embodiment, the sidewall oxide 106B is also on a portion of the switching layer 104.

In an embodiment, the oxygen exchange layer 106 acts as a source of oxygen vacancies or as a sink for oxygen atoms in filamentary RRAM devices. The oxygen vacancies migrate to and from the oxygen exchange layer into the switching layer 104, in response to an applied voltage between the top and bottom electrode to enable resistance switching in the RRAM device 100A. The oxygen exchange layer 106 may include a metal such as tungsten, hafnium, tantalum or titanium. In an embodiment, oxygen exchange layer 106 has a thickness between 5 nm and 20 nm.

In an exemplary embodiment, the sidewall oxide 106B includes a metal of the oxygen exchange layer and oxygen. In other examples, when the oxygen exchange layer 106 and the switching layer include a same metal, and the sidewall oxide 106B includes a metal of the switching layer 104. In an embodiment, when the sidewall oxide 106B includes a metal of the switching layer 104, the sidewall oxide 106B has a lateral thickness, $T_{SOEL}$, exceeding a vertical thickness of the switching layer 104. For example, the lateral thickness, $T_{SOEL}$ may be greater than 5 nm. In other examples, the sidewall oxide 106B additionally includes one or more elements included in the top electrode 108 and/or bottom electrode 102.

The top electrode 108 includes one or more metals or an alloy including one or more metals. Exemplary compositions of the top electrode 108 includes a material such as W, Ta, TaN, TiN, Pt, Pd or Cu. In an embodiment, the top electrode 108 includes a metal that can exist as a stable oxide. In some such embodiments, the RRAM device 100A includes a sidewall oxide 108B that includes oxygen and the metal that can exist as a stable oxide, in contact with a sidewall 108A of the top electrode 108, as illustrated in FIG. 1A. When the top electrode 108 includes an inert metal such as Pt or Pd, the RRAM device 100A may not include a sidewall oxide 108B.

In other examples, the top electrode 108 includes an alloy. The alloy may include a metal that is the same as the metal of the oxygen exchange layer 106. In some such examples, the sidewall oxide 108B has substantially the same lateral thickness, $T_{STEL}$ as the thickness, $T_{SOEL}$, of the sidewall oxide 106B. In other examples, where the alloy does not include the metal of the oxygen exchange layer 106, the lateral thickness, $T_{STEL}$ may be more or less than $T_{SOEL}$.

In some embodiments, the top electrode 108 has a vertical thickness between 20 nm and 70 nm. In the illustrative embodiment, the sidewall oxide 108B has substantially the same vertical thickness as the top electrode 108. The sidewall oxide 108B is also in contact with a top portion of the sidewall oxide 106B, as shown.

In an embodiment, the switching layer 104 includes oxygen and a metal (M), such as hafnium, tantalum, zirconium, tungsten, aluminum or titanium. Exemplary compositions of the switching layer 104 include hafnium oxide, tantalum oxide, zirconium oxide, titanium oxide, tungsten oxide or aluminum oxide. The switching layer 104 may be stoichiometric or non-stoichiometric in oxygen content. When the switching layer 104 includes a metal such as hafnium, having an oxidation state +4, the switching layer 104 has a chemical composition of MOx, where O is oxygen and X is, or is substantially close to, 2, such as between 1.9-2.0. When the switching layer 104 includes a metal such as tantalum having an oxidation state +5, the switching layer 104 has a chemical composition of $M_2Ox$, where O is oxygen and X is or is substantially close to 5, such as between 4.90-5.0. For any of these compositions, the thickness of the switching layer 104 may vary. In one embodiment, the switching layer 104 has a thickness of at least 1 nm. In another embodiment, switching layer 104 has a thickness between 1 nm and 4.5 nm.

In some embodiments, the switching layer 104 includes a stoichiometric oxide that may not be structurally homogenous across the cross-sectional plane in FIG. 1A. For example, a switching layer portion 104A may have lattice dislocations, indicative of damage during the fabrication process. In other embodiments, when the switching layer 104 includes a non-stoichiometric oxide, switching layer portion 104A may have lattice dislocations and be stoichiometric.

In some embodiments, the RRAM device 100A further includes a cap 110 above the top electrode 108, such as shown in FIG. 1A. The cap 110 may be utilized as an intermediate layer between the top electrode 108 and a metallization structure 122 above, as shown. In some examples, the cap 110 may be utilized when the top electrode 108 includes a thin inert electrode. The thin inert electrode may be less than 10 nm in vertical thickness. When RRAM devices are scaled laterally in size and approach a lateral thickness of the metallization structure 122, any misalignment between the metallization structure 122 and the RRAM device 100A may cause portions of the metallization structure 122 to extend along a sidewall of the cap 110. A relatively thick cap 110 may advantageously prevent the metallization structure 122 from extending to or below a thin top electrode 108 to the oxygen exchange layer 106. In some such embodiments, the cap 110 includes a conductive material that is relatively easy to pattern and is substantially thicker than 10 nm, such as for example between 50 nm and 100 nm.

In an embodiment, the cap 110 includes a metal that can chemically combine with oxygen. For example, the cap 110 may include one or more metals such as W, Ta, Ti, or an alloy such as WN, TaN, TiN. In some such embodiments, the RRAM device 100A includes a sidewall oxide 110B that includes oxygen and the metal that can that can chemically combine with oxygen, (for e.g., Ta2O5, TiO2 etc.) in contact with a sidewall 110A of the cap 110, as illustrated in FIG. 1A.

In some examples, the cap 110 includes a metal that is the same as the metal of the oxygen exchange layer 106. In some such examples, the sidewall oxide 110B has substantially the same lateral thickness, $T_{SC}$ as the thickness, $T_{SOEL}$, of the sidewall oxide 106B. In other examples, where the cap 110 does not include the metal of the oxygen exchange layer 106, the lateral thickness, $T_{SC}$ may be more or less than $T_{SOEL}$.

The cap 110 may not have a well-defined surface. In other embodiments, the sidewall 110A is substantially vertical. In the illustrative embodiment, the sidewall 110A has a hemispherical shape. In some such embodiments, the sidewall oxide 110B also has a hemispherical shape, as shown.

The various layers in the RRAM device 100A may not have a same lateral thickness or diameter within a cross-sectional plane of the RRAM device 100A. In the illustrative embodiment, for example, a diameter, $D_{OEL}$ of the oxygen exchange layer 106 is representative of the largest dimension of the oxygen exchange layer 106, within a cross-sectional plane of the RRAM device 100A. The diameter $D_{OEL}$ is smaller than a diameter $D_{SL}$, that is representative of the largest dimension of the switching layer 104, as shown.

In some examples, the diameter, $D_{OEL}$ summed with twice the lateral thickness, $T_{OEL}$ of the sidewall oxide 106B may be equal to the diameter, $D_{SL}$ of the switching layer 104. In other examples, the diameter, $D_{OEL}$ summed with twice the lateral thickness, $T_{OEL}$ of the sidewall oxide 106B may be larger than the diameter, $D_{SL}$ of the switching layer 104. In the illustrative embodiment, for example, a diameter, $D_{BE}$ of the bottom electrode 102 is representative of the largest dimension of the bottom electrode 102, within the cross-sectional plane of the RRAM device 100A. As shown, diameter, $D_{BE}$ is substantially similar to the diameter, $D_{SL}$ of the switching layer 104.

Figure 1B:
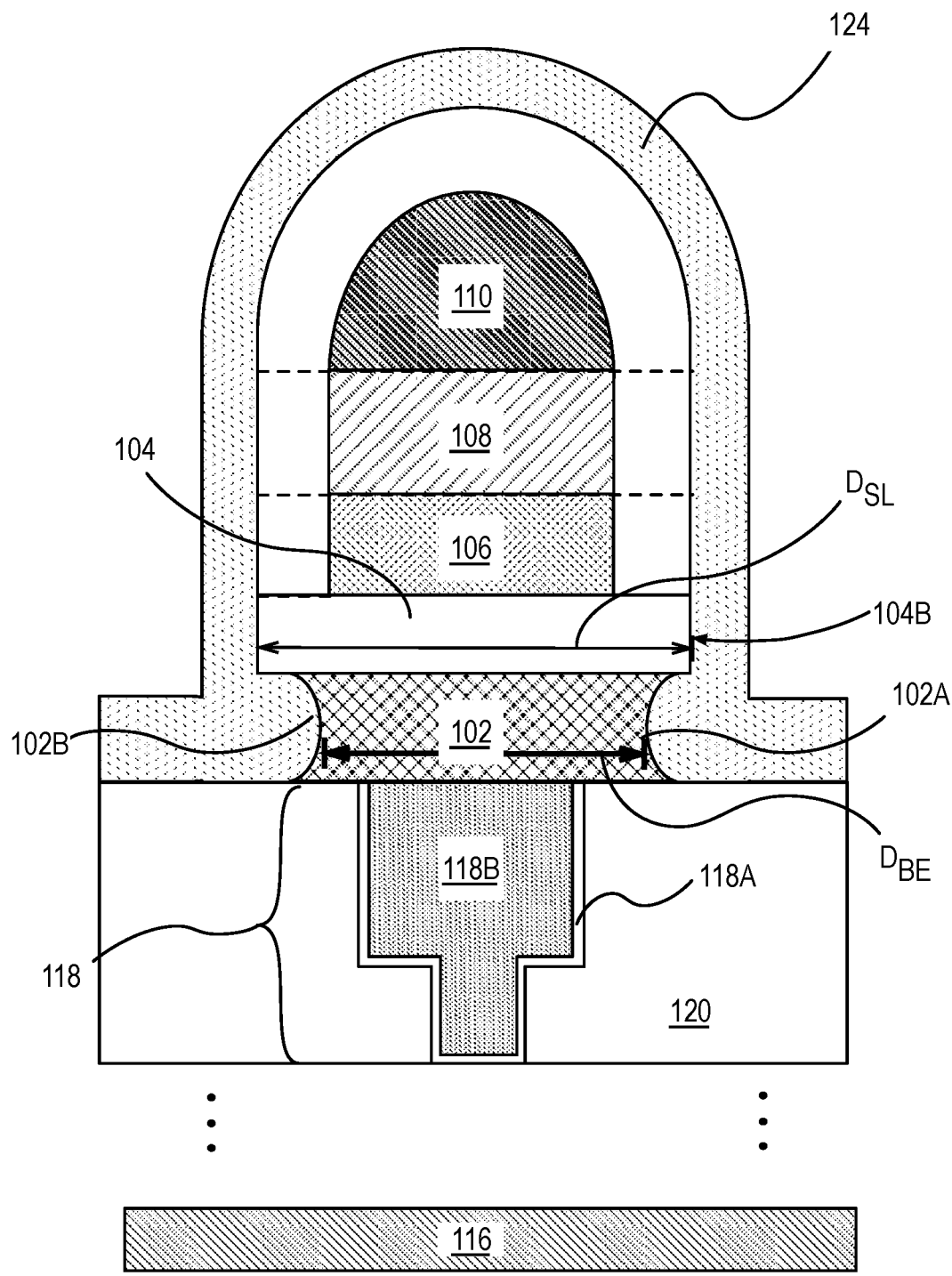
FIG. 1B illustrates a cross-sectional view of a RRAM device including a sidewall oxide, in accordance with an embodiment of the present disclosure.

In other embodiments, the diameter, $D_{BE}$ is smaller than the diameter, $D_{SL}$ of the switching layer 104, such as for example, as illustrated in FIG. 1B. In some such embodiments, the bottom electrode 102 has a sidewall 102A, that is recessed under the switching layer 104. Such a recess may be indicative of the method used to fabricate the RRAM device 100B.

Referring again to FIG. 1A, the RRAM device 100A further includes a dielectric liner 124 over the oxide sidewall 106B. A dielectric liner 124 may be utilized to prevent uncontrolled oxidation of one or more layers in the RRAM device 100A, over the fabrication lifetime of the RRAM device. As shown the dielectric liner 124 is also adjacent to the oxide sidewalls 108B and 110B. The dielectric liner 124 is also in contact with the sidewall 104B of the switching layer 104. The dielectric liner has a composition that is substantially free of metal. In an exemplary embodiment, the dielectric liner includes silicon and nitrogen.

In an embodiment, the RRAM device 100A is above a metallization structure 118. Such a metallization structure 118 may include lateral runs (e.g., metallized trenches within dielectric) and vertical runs (e.g., metallized vias). As shown, the metallization structure 118 has an uppermost surface that is coplanar or substantially co-planar with an uppermost surface of the dielectric layer 120. The metallization structure 118 may include a barrier layer 118A, and a fill metal 118B on the barrier layer 118A. In an embodiment, the barrier layer 118A includes a material such as but not limited to tantalum nitride, tantalum or ruthenium. In an embodiment, the fill metal 118B includes a metal such as W or Cu. In the illustrative embodiment, for example, a diameter, $D_{MS}$ of the metallization structure 118 is representative of the largest dimension of the metallization structure 118, within the cross-sectional plane of the RRAM device 100A. The diameter, $D_{MS}$ may be equal to, larger than or smaller than $D_{BE}$. In the illustrative embodiment, the $D_{MS}$ is smaller than $D_{BE}$.

FIG. 2 illustrates a flow chart for a method to fabricate an RRAM device, in accordance with an embodiment of the present disclosure. In an embodiment, the method 200 begins in operation 210 by forming a first conductive layer above a substrate. The method 200 continues in operation 220 by forming an oxide layer on the first conductive layer. The method 200 continues in operation 230 by forming a second conductive layer on the oxide layer. The method 200 continues in operation 240 by forming a third conductive layer on the second conductive layer. The method 200 continues in operation 250 by patterning the third conductive layer, the second conductive layer and the oxide layer to form sidewalls. The method 200 continues in operation 260 by plasma oxidation of the second conductive layer to form a sidewall oxide adjacent to the second conductive layer. The method 200 continues in operation 270 by patterning the first conductive layer.

FIGS. 3A-3F illustrate cross sectional views of the RRAM device 100A illustrated in FIG. 1A evolving as a fabrication method, such as method 200, is practiced.

Figure 3A:
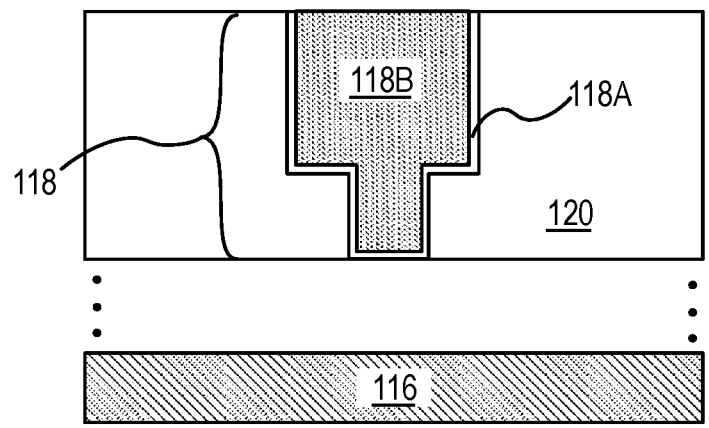
FIG. 3A illustrates a via formed above a metallization structure that is formed above a substrate.

FIG. 3A illustrates a metallization structure 118 surrounded by a dielectric material 120 formed above a substrate 116. In an embodiment, the metallization structure 118 is formed in a dielectric material 120 by a damascene or a dual damascene process. In an embodiment, the metallization structure 118 includes a barrier layer, such as titanium nitride, ruthenium, tantalum, tantalum nitride, and a fill metal, such as copper, tungsten. In an embodiment, the metallization structure 118 is fabricated using a subtractive etch process when materials other than copper are utilized. In one such embodiment, the metallization structure 118 include a material such as but not limited to titanium nitride, ruthenium, tantalum, tantalum nitride or tungsten. In some examples, the dielectric material 120 includes a material such as but not limited to silicon dioxide, silicon nitride, silicon carbide, or carbon doped silicon oxide. In an embodiment, the dielectric material 120 has an uppermost surface substantially co-planar with an uppermost surface of the metallization structure 118. In some examples, metallization structure 118 may be electrically connected to a circuit element such as an access transistor (not shown). Logic devices such as access transistors may be integrated with memory devices such as a RRAM device to form embedded memory.

Figure 3B:
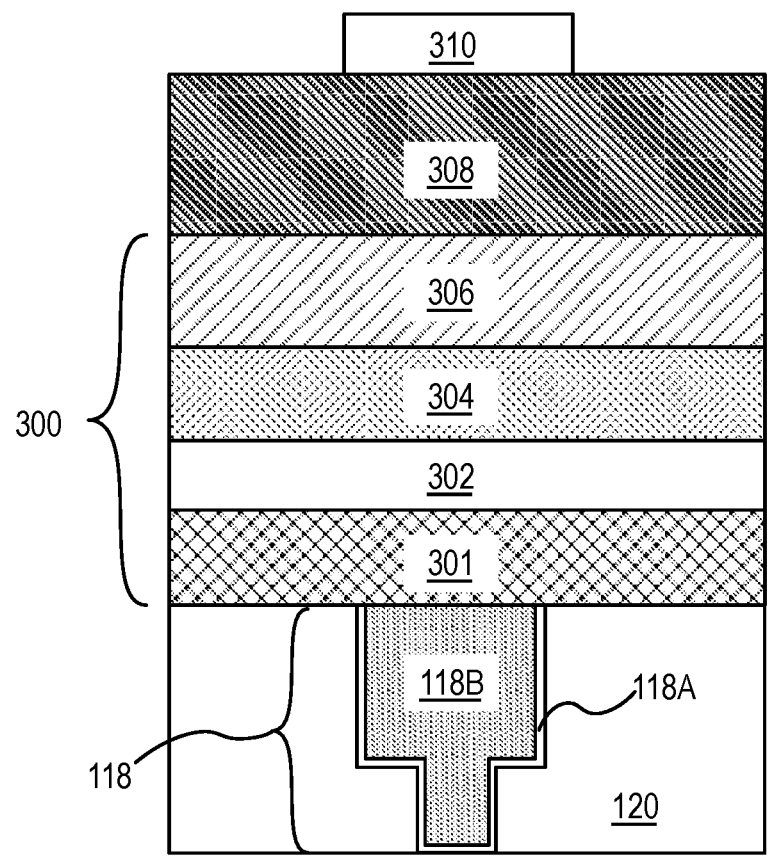
FIG. 3B illustrates the structure of FIG. 3A following the formation of a material layer stack for an RRAM device, on a metallization structure and on a portion of a dielectric material.

FIG. 3B illustrates the structure of FIG. 3A following the formation of a material layer stack 300 utilized in the formation of an RRAM device, on a portion of the dielectric material 120 and on the metallization structure 118. In an embodiment, the conductive layer 301 is blanket deposited by a physical vapor deposition (PVD), a chemical vapor deposition (CVD), a plasma enhanced chemical vapor deposition (PECVD) or an atomic layer deposition process (ALD). In an embodiment, the conductive layer 301 includes a metal such as but not limited to Pt, W, Ru, Ti or Ta or an alloy such as but not limited to WN, TiN or TaN. The choice of materials utilized to form the conductive layer 301 results in conductive layer 301 having a low electrical resistivity, such as an electrical resistivity between 100-250µ-Ω-cm.

In an embodiment, the conductive layer 301 may be planarized before deposition of additional layers of the material layer stack 300. Planarization may enable the top surface 301A of the conductive layer 301 to have a surface roughness that is less than 1 nm. A surface roughness of less than 1 nm enables an oxide layer 302 having a uniform thickness to be deposited on surface of the conductive layer 301. A uniform thickness in the oxide layer 302 is desirable to reduce variation in forming voltage in a large collection of RRAM devices.

In other embodiments, a oxide layer 302 is deposited on the conductive layer 301 without breaking vacuum, as shown. In an embodiment, the oxide layer 302 is a material that includes oxygen and a metal such as $HfO_2$, $Ta_2O_5$, $TiO_2$, $ZrO_2$ or $Al_2O_3$. In an embodiment, the oxide layer 302 is a stoichiometric oxide of the metal such as Hf, Ta, Ti, Zr or Al. A stoichiometric oxide layer 302 may be formed using an atomic layer deposition (ALD) process. The ALD process may be characterized by a slow and a controlled deposition rate resulting in a metal oxide film with a stoichiometric oxygen content. In some embodiments, the oxide layer 302 is deposited using a physical vapor deposition (PVD) process. The PVD process may include depositing a metal oxide film in an ambient containing oxygen flowing at a constant or at a variable rate. Such a deposition process may form a oxide layer 302 that is slightly deficient in oxygen concentration resulting in a film that is non-stoichiometric in oxygen content.

In some such embodiments, the oxide layer 302 has an oxygen concentration gradient with higher concentration of oxygen proximate to the conductive layer surface 301A and a lower concentration of oxygen distal from the conductive layer surface 301A. Such an arrangement may preferably provide greater oxygen vacancies in a location that aids with filament formation and dissolution. Regardless of the deposition process, the oxide layer 302 may be deposited to a thickness between 2 nm and 5 nm, for example.

The deposition method is continued with the formation of a conductive layer 304 on the oxide layer 302. The conductive layer 304 may include a material having a composition and a thickness, such as is described above in association with the oxygen exchange layer 106. In some embodiments, the conductive layer 304 includes a metal of the oxide layer 302. Utilizing a metal that is the same as the metal of the oxide layer 302 facilitates oxygen vacancies within an upper portion of the oxide layer 302 following an anneal process (described further below). The presence of oxygen vacancies may reduce the electro-forming voltage during operation. In an embodiment, the conductive layer 304 is blanket deposited on the oxide layer 302, for example, using a PVD process.

The deposition method is continued with the formation of a conductive layer 306 on the conductive layer 304. In an embodiment, the conductive layer 306 includes a material that is the same as, or substantially the same as, the material of the top electrode 108 (described in association with FIG. 1A). The conductive layer 306 may be deposited using a PVD process. In one example the conductive layer 306 and the conductive layer 304 are deposited sequentially in a same chamber or in a same tool without breaking vacuum. Sequential deposition without an air-break may prevent an uppermost portion of the conductive layer 304 from becoming oxidized. Oxidation of the conductive layer 304 can introduce variability in electro-forming voltage and variability in switching voltages during RRAM device operation.

In an embodiment, the conductive layer 306 may be deposited to a thickness that may be utilized as a hardmask to pattern layers below the conductive layer 306. In other embodiments, the conductive layer 306 is utilized as a work function electrode and may include a material that is substantially difficult to pattern when deposited to a thickness greater than 10 nm. In some such embodiments, the conductive layer 306 is deposited to a thickness of approximately 10 nm and a capping layer 308 is deposited on the conductive layer 306. In other embodiments, the capping layer 308 is deposited regardless of the thickness of the conductive layer 306. Portions of the capping layer 308 may be sacrificed during subsequent processing operations. In an embodiment, the capping layer 308 is blanket deposited using one of the deposition processes described above. The capping layer 308 is deposited to a thickness between 20 nm and 100 nm.

Upon deposition of the capping layer 308, the RRAM material layer stack 300, may be subjected to a high temperature anneal process. In an embodiment, anneal temperatures reach up to 400° C. and last for a time period of up to 60 minutes. Annealing is a thermal phenomenon that may drive the oxygen from the oxide layer 302, creating oxygen vacancies, $V_o$, in the switching layers. When the conductive layer 304 includes a purely metallic layer, the oxygen from the oxide layer 302 may diffuse toward the conductive layer 304 above. The anneal may increase the $V_o$ density in the oxide layer 302 priming it for conductive filament creation during the electro-forming process.

After annealing the material layer stack 300, a mask 310 is formed on the material layer stack 300. In the illustrative embodiment, the mask 310 is formed on the capping layer 308. In some embodiments, the mask 310 is formed by a lithographic process. In other embodiments, the mask 310 includes a dielectric material that has been patterned. The mask 310 defines a size of an RRAM device that will subsequently be formed.

Figure 3C:
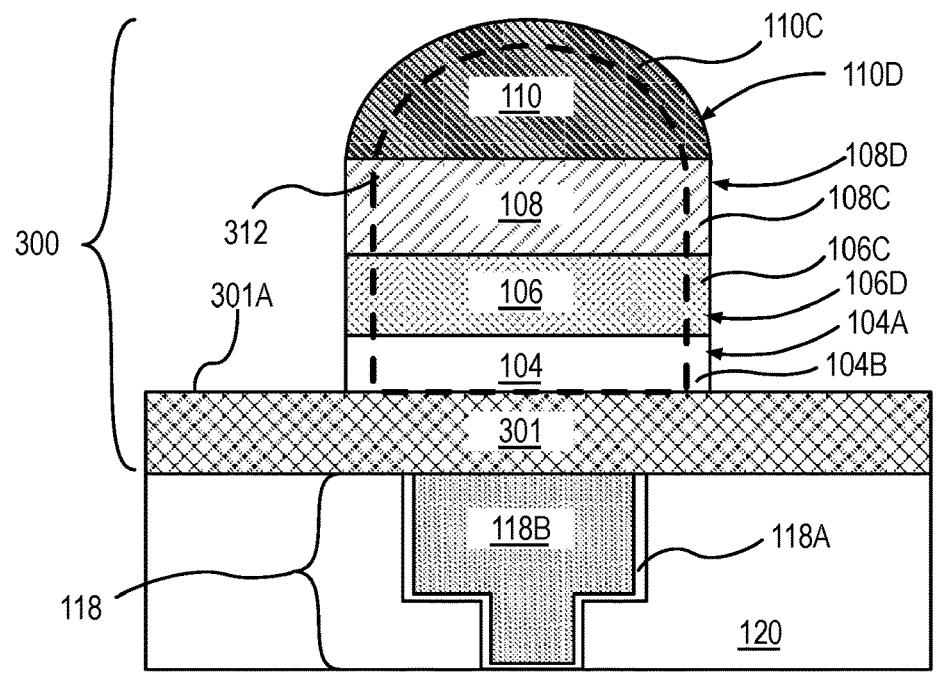
FIG. 3C illustrates the structure of FIG. 3B following an etch process used to etch a plurality of layers of the material layer stack.

FIG. 3C illustrates the structure of FIG. 3B following an etch process used to etch a plurality of layers of the material layer stack 300. In an embodiment, an anisotropic plasma etch process is used to pattern the capping layer 308 to form a cap 110. Portions of the cap 110 may be eroded during the etch process resulting in a sidewall 110D that is curved as shown. The plasma etch is continued to etch the conductive layer 306, the conductive layer 304 and the oxide layer 302 to form a top electrode 108, oxygen exchange layer 106 and switching layer 104, respectively. In an embodiment, the plasma etch may be stopped after etching the oxide layer 302 and exposing the conductive layer 301.

In some embodiments, portions of one or more layers of the material layer stack 300 may become damaged by attack from energetic ion species during the plasma etch. In one embodiment, a switching layer portion 104B proximal to the sidewall 104A becomes damaged, for example by energetic ion species during the plasma etch. The switching layer portion 104B is the region between the sidewall 104A and the dashed line 312. A damaged switching layer portion 104B may cause filaments to randomly form near the vicinity of the sidewall 104A. Random formation of filaments in the switching layer 104 of an RRAM device can lead to variation in the electroforming voltage and introduce variations in the switching voltage.

In other embodiments, oxygen exchange layer portion 106C proximal to a sidewall 106D of the oxygen exchange layer 106 is also damaged, for example by energetic ion species during the plasma etch. The oxygen exchange layer portion 106C is the region between the sidewall 106D and the dashed line 312. In an embodiment, the top electrode portion 108C proximal to the sidewall 108D is also damaged, for example by energetic ion species during the plasma etch. The top electrode portion 108C is the region between the sidewall 108D and the dashed line 312. In an embodiment, the cap portion 110C proximal to the sidewall 110D is also damaged by attack from energetic ion species during the plasma etch to varying levels. The cap portion 110C is the region between the sidewall 110D and the dashed line 312.

The extent of damage to the portions 104B, 106C, 108C and 110C may vary. In the illustrative embodiment, the dashed line 312 indicates the damage to portions 104B, 106C, 108C and 110C is substantially the same. In some embodiments, the amount of damage to portions 104B, 106C, 108C and 110C may not be uniform. In other embodiments, there may be little to no damage to portions 104B, 106C, 108C and 110C.

In some embodiments, an etch residue, can form from an interaction between a photoresist material of the mask and etch byproducts during the plasma etch process. The etch residue may have metallic components and need not be uniform in thickness. For example, the etch residue can be uniformly or sporadically deposited on one or more of the sidewalls 104A, 106D, 108D and 110D of the etched layers of the material layer stack 300. In an embodiment, the etch residue adheres to sidewalls 104A and 106D. In some examples, the etch residue may extend continuously from the sidewall 106D to the top surface 301A of the conductive layer 301. When an etch residue having metallic components, connects the oxygen exchange layer 106 and the top surface 301A, an electrical short path may be created, if left untreated. In other examples, the etch residue including metallic components may also adhere to the sidewalls 108D and 110D.

Figure 3D:
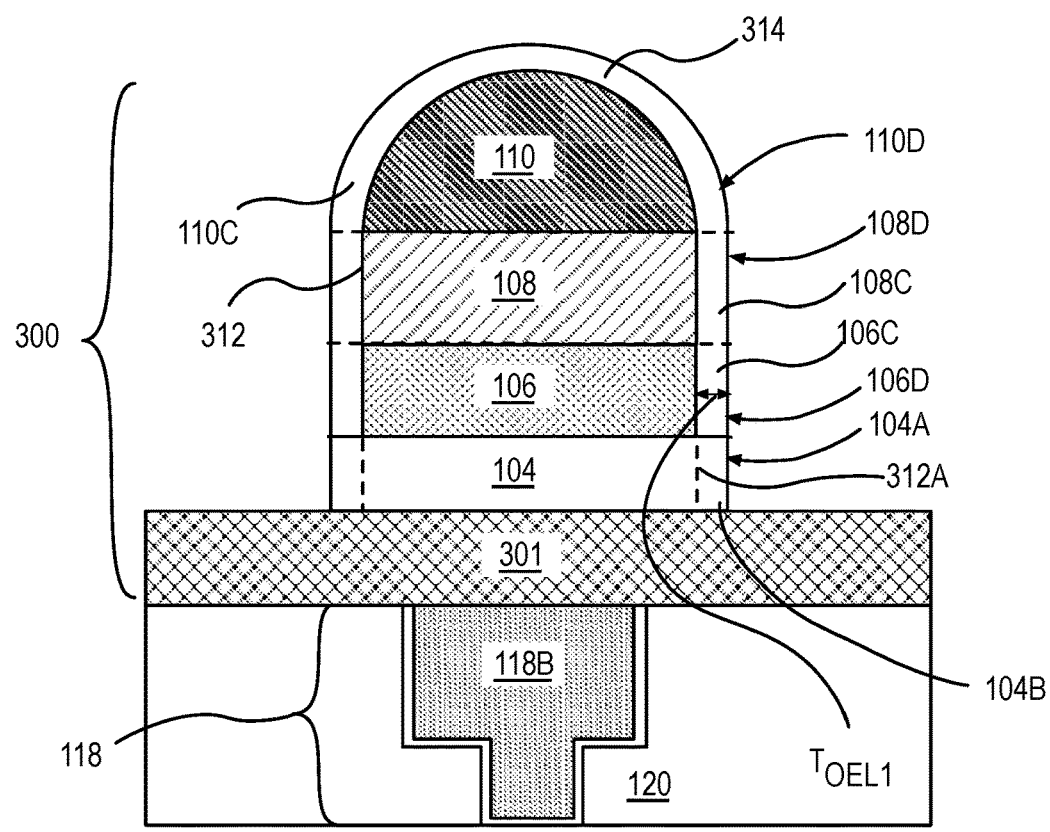
FIG. 3D illustrates the structure of FIG. 3C after an oxidation process.

FIG. 3D illustrates the structure of FIG. 3C after an oxidation process but before etching the conductive layer 301. In an embodiment, a combination of sidewall damage and a plasma oxidation process may oxidize the one or more layers in the etched material layer stack 300. In an embodiment, the oxidation process includes plasma oxidation. The plasma oxidation process may be utilized to oxidize one or more layers of the material layer stack 300.

The relative extent of oxidation of each of the one or more layers in the etched material layer stack 300 need not be equal. The relative extent of oxidation of each of the one or more layers in the etched material layer stack 300 may depend on factors such as, the choice of materials of the various layers in the material layer stack 300, response to plasma oxidation and on the intensity of the oxidation process.

In one embodiment, the plasma oxidation process may oxidize the oxygen exchange layer portion 106C. In an embodiment, the top electrode 108 includes a material that can be oxidized. In one such embodiment, the plasma oxidation process can oxidize the top electrode layer portion 108C. In another embodiment, the cap 110 includes a material that can be oxidized. In one such embodiment, the plasma oxidation process can oxidize the cap portion 110C. In the illustrative embodiment, the plasma oxidation process may mitigate damage on the sidewall of the switching layer 104, since the switching layer inherently includes an oxide, the switching layer does not undergo further oxidation. In some examples, when the switching layer is a sub-stoichiometric oxide the switching layer portion 104B may also be oxidized to become fully stoichiometric.

In the illustrative embodiment, the portions 106C, 108C and 110C are oxidized to form an oxidized boundary layer 314. The oxidized boundary layer 314 may be uniformly thick as shown across the various portions 106C, 108C and 110C. In an exemplary embodiment, the switching layer 104 includes tantalum and oxygen, the oxygen exchange layer includes tantalum, the top electrode includes tantalum and nitrogen (for e.g., TaN) and the cap 110 includes tantalum. In one such embodiment, the oxidized boundary layer 314 includes a tantalum and oxygen such as, for example, $Ta_2O_5$.

In an embodiment, the switching layer portion 104B between the dashed line 312A and the sidewall 104A may be previously damaged by the plasma etch. When such a damaged switching layer portion 104B is exposed to a plasma oxidation process, portions may become annealed and damage may be mitigated.

A plasma oxidation process may be utilized to also oxidize etch residue that may have formed on sidewalls of one or more layers of the material layer stack 300. For example, the plasma oxidation process may oxidize any metallic residue that may have formed on sidewalls of the one or more layers in the material layer stack 300. For example, etch residue adhered to one or more sidewalls 104A, 106D, 108D and 110D of the material layer stack 300, may be oxidized by the plasma oxidation process.

The etch residue may not be contiguous with portions of the sidewalls exposed after the etch process. In some embodiments, the etch residue may coat sidewalls of the patterned material layer stack 300. In some such embodiments, portions of the one or more layers in the material layer stack 300 within the corresponding one or more sidewalls of the one or more layers may also become oxidized along with oxidation of the etch residue.

Figure 3E:
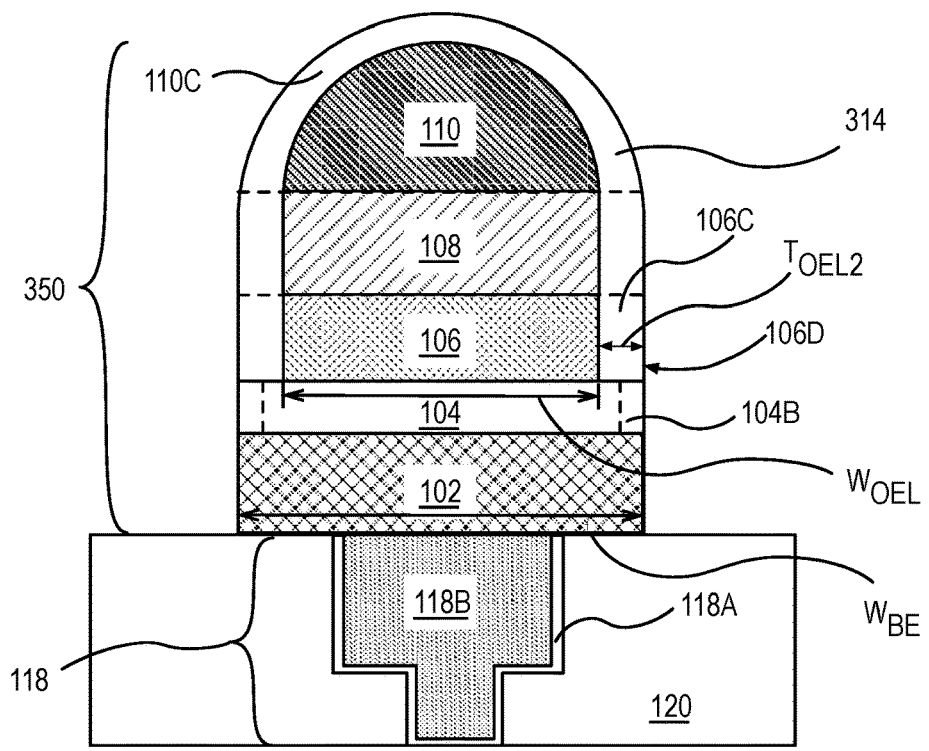
FIG. 3E illustrates the structure of FIG. 3D following the etching of the conductive layer to form an RRAM device in accordance with embodiments of the present disclosure.

FIG. 3E illustrates the structure of FIG. 3D following the etching of the conductive layer 301, to form an RRAM device 350 in accordance with embodiments of the present disclosure. The process utilized to etch the conductive layer 301 may depend on the thickness and choice of material of the conductive layer 301. In an embodiment, the conductive layer 306 is etched using a plasma etch process, selectively to the underlying dielectric material 120, to form a bottom electrode 102. In an embodiment, the switching layer 104 may act as a mask during the plasma etch process. In the illustrative embodiment, the oxidized boundary layer 314 and the switching layer 104 act as a mask to pattern the conductive layer 301. When the conductive layer 301 is patterned after formation of the oxidized boundary layer 314, the width, $W_{BE}$, of the bottom electrode 102 may be larger than a width of the oxygen exchange layer, $W_{OEL}$.

Portions of the oxidized boundary layer 314, such as oxygen exchange layer portion 106C may erode during the etch process. Depending on the material of the conductive layer 301, portions of the oxidized boundary layer 314 above the cap 110, such as cap portion 110C may also become etched, as shown. In other embodiments discussed below, the oxidized boundary layer 314 is not etched.

In other embodiments, one or more portions 106C, 108C and 110C may become thicker during the plasma etch process. In an embodiment, the combination of a plasma oxidation process (described above) followed by a plasma etch process to form the bottom electrode 102, can increase the thickness of one or more portions 106C, 108C and 110C.

In some embodiments, the conductive layer 301 includes a material that can be etched by a gas chemistry that includes oxygen. In some such embodiments, the plasma etch process can further oxidize one or more layers in the material layer stack 300. For example, a portion of the oxygen exchange layer 106 proximal to the oxygen exchange layer portion 106C may be oxidized further. In another example, a portion of the top electrode 108 proximal to the top electrode portion 108C may be oxidized further. And in another example, a portion of the cap 110 proximal to the cap portion 110C may be oxidized further. In the illustrative embodiment, a portion of the oxygen exchange layer 106 proximal to the oxygen exchange layer portion 106C, a portion of the top electrode 108 proximal to the top electrode portion 108C and a portion of the cap 110 proximal to the cap portion 110C are all oxidized.

By oxidizing a portion of the oxygen exchange layer 106 proximal to the oxygen exchange layer portion 106C, a portion of the top electrode 108 proximal to the top electrode portion 108C and a portion of the cap 110 proximal to the cap portion 110C, the thickness of the oxidized boundary layer 314 can, for example, further increase. In the illustrative embodiment, the oxygen exchange layer portion 106C (after further oxidation) has a thickness, $T_{OEL2}$ that is greater than a thickness, $T_{OEL1}$ of the oxygen exchange layer portion 106C illustrated in FIG. 3D.

In some examples, the oxidized boundary layer 314 (for e.g., of the oxygen exchange layer portion 106C) can have a thickness, $T_{OEL2}$ that is greater than a thickness of the switching layer 104. In other examples the thickness of the oxidized boundary layer 314 may be at least 5 nm and as much as 8 nm.

Figure 3F:
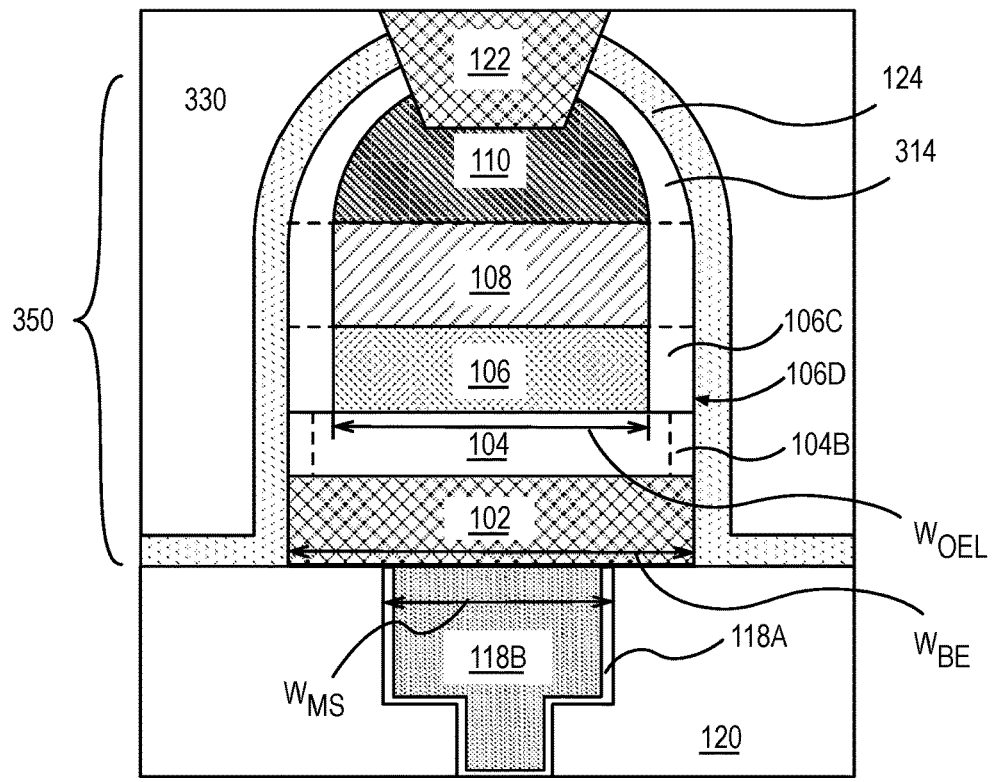
FIG. 3F illustrates the structure of FIG. 3E following the formation of a dielectric spacer layer covering the RRAM device and the formation of a metallization structure on the RRAM device.

In an embodiment, the bottom electrode device has a width $W_{BE}$ and the metallization structure 118 has a width, $W_{MS}$, as shown in FIG. 3F. In the illustrative embodiment, $W_{BE}$ is greater than $W_{MS}$. In some such embodiments, the metallization structure 118 is not exposed when the conductive layer 301 is etched. In other examples, $W_{BE}$ may be less than $W_{MS}$. In some such examples, there may be one or more intervening layers between the metallization structure 118 and the conductive layer 301. The one or more intervening layers may prevent etching of the metallization structure 118 when the conductive layer 301 is completely patterned. The one or more intervening layers may be patterned before or after the formation of the bottom electrode 102.

FIG. 3F illustrates the structure of FIG. 3E following the formation of a dielectric spacer layer 124 covering the RRAM device 350 and the formation of a metallization structure 124 through the oxidized boundary layer 314 on cap 110. The dielectric spacer layer 124 may be blanket deposited by a PVD, PECVD or an ALD process. In some embodiments, the dielectric spacer layer 124 is deposited immediately after etching the conductive layer 301 and forms a hermetic seal around the RRAM device 350. In an embodiment, the dielectric spacer layer 124 includes a material such as silicon nitride, silicon carbide, carbon-doped silicon nitride, silicon dioxide. In an embodiment, the dielectric spacer layer 124 has a thickness between 10 nm and 50 nm.

A metallization structure 340 may be formed on the RRAM device 350 after deposition of a dielectric material 330 on the RRAM device. In an embodiment, a via opening (not shown) may be patterned in the dielectric material 330. The via opening etches a portion of the dielectric spacer layer 124 to contact the RRAM device 350. In the illustrative embodiment, the via opening also etches through the cap portion 110C above the cap 110 and a top portion of the cap 110. A material of the metallization structure 122 may be deposited into the via opening and subsequently planarized to form the metallization structure 122. In an embodiment, the metallization structure includes one or more of tungsten, ruthenium or cobalt.

In some embodiments, a second plasma oxidation process may be carried out after forming the bottom electrode 102. The second plasma oxidation process may be carried out, for example, if one or more portions 106C, 108C or 110C of the oxidized boundary layer 314 is thinned during pattering of the conductive layer 301.

Figure 4A:
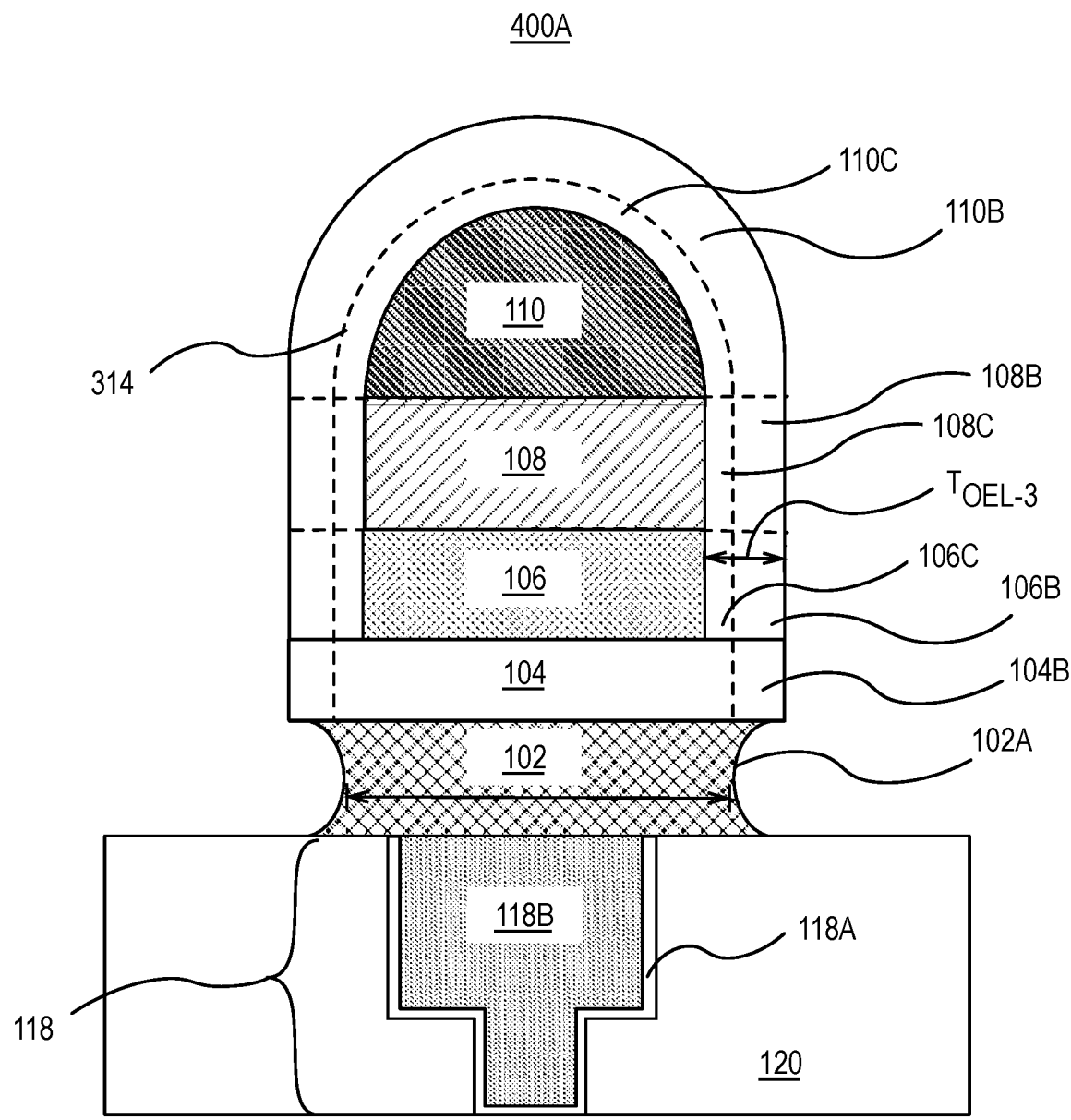
FIG. 4A illustrates the structure of FIG. 3E following a second oxidation process after fabrication of the RRAM device but before formation of the dielectric spacer layer.

FIG. 4A illustrates the structure of FIG. 3E following a second plasma oxidation process after fabrication of the RRAM device 350. In an embodiment, the second plasma oxidation process may be substantially similar to the plasma oxidation process described above. The second plasma oxidation process may further oxidize one or more portions 106B, 108B or 110B of the corresponding one or more of the layers in the RRAM device 350. In an embodiment, the second plasma oxidation process further oxidizes an oxygen exchange layer portion 106C adjacent to the oxygen exchange layer portion 106B. As shown, the oxygen exchange layer portions 106B and 106C have a combined thickness $T_{OEL-3}$, after the oxidation process. In the illustrative embodiment, the second plasma oxidation process further oxidizes a top electrode portion 108C adjacent to the top electrode portion 108B and also oxidizes a cap portion 110C adjacent to cap portion 110B. The oxidized boundary layer 314 extends around the oxygen exchange layer 106, the top electrode 108 and the cap 110, as shown.

In an embodiment, the second plasma oxidation process may also etch portions of the bottom electrode 102. In the illustrative embodiment, the second plasma oxidation process recesses sidewalls 102A and 102B of the bottom electrode 102. As shown, the switching layer sidewall 104B is laterally beyond the sidewall 102A.

Figure 4B:
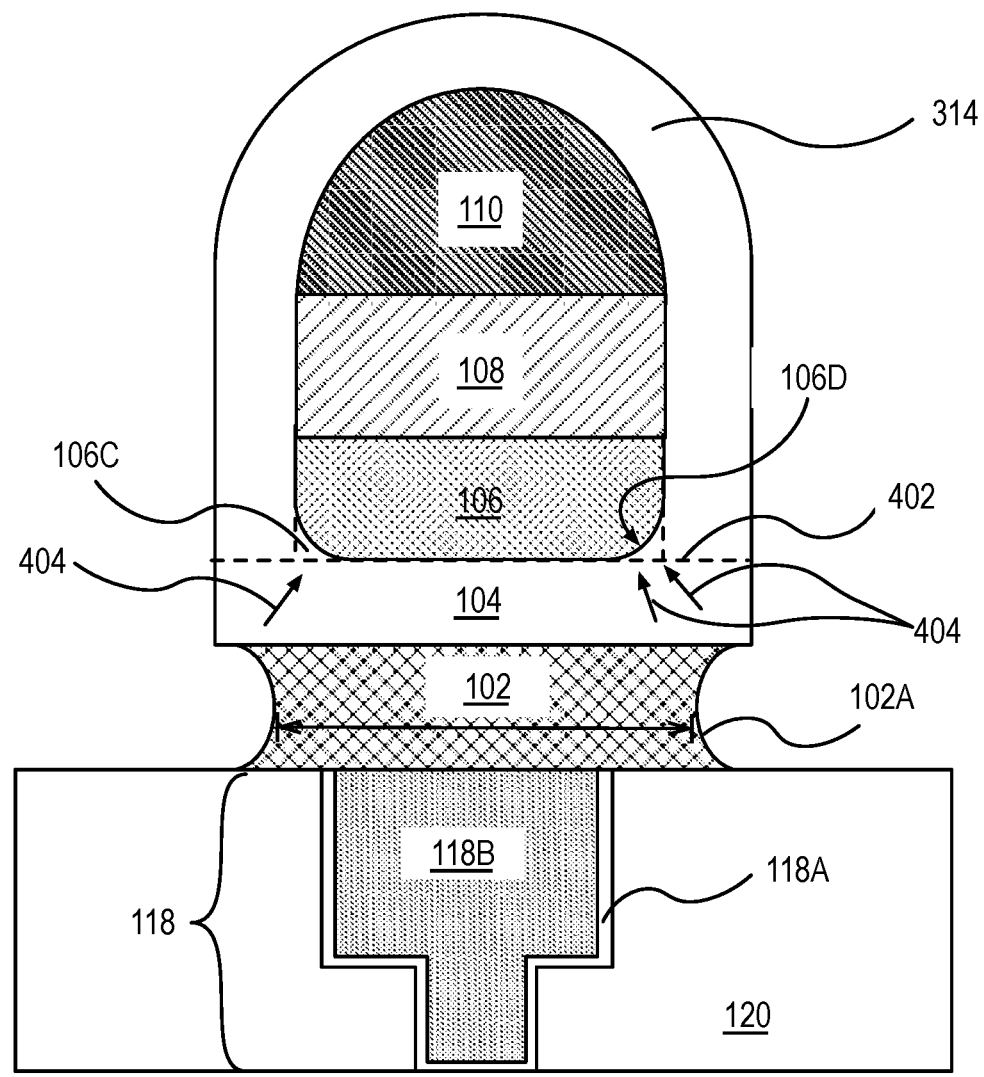
FIG. 4B illustrates the structure of FIG. 4A, where a portion of an oxygen exchange layer at interface with a sidewall oxide and a switching layer is oxidized.

In some embodiments, the oxygen exchange layer 106 in an RRAM device, such as RRAM device 400A, includes a metal of the switching layer 104. In some such embodiments, when the RRAM device undergoes plasma oxidation, oxygen starts to diffuse near the interface 402 between the switching layer 104 and the oxygen exchange layer 104. Diffusion of oxygen (indicated by arrows 404) near the interface 402 may cause a portion 106C of the oxygen exchange layer to become oxidized in the RRAM device 400B, as illustrated in FIG. 4B. The oxygen exchange layer 106 may also have a bottom surface having a curved portion 106D as shown.

In some embodiments, the portion 106C may become indistinguishable from the switching layer 104, after the oxidation. For example, when each of oxygen exchange layer 106, the top electrode 108 and the cap 110 include a metal of the switching layer 104, the oxidized boundary layer 314 formed includes the metal of switching layer and oxygen. In some embodiments, the oxidized boundary layer 314 also includes trace elements of one or more materials of the bottom electrode 102 after the second plasma oxidation process.

Figure 5A:
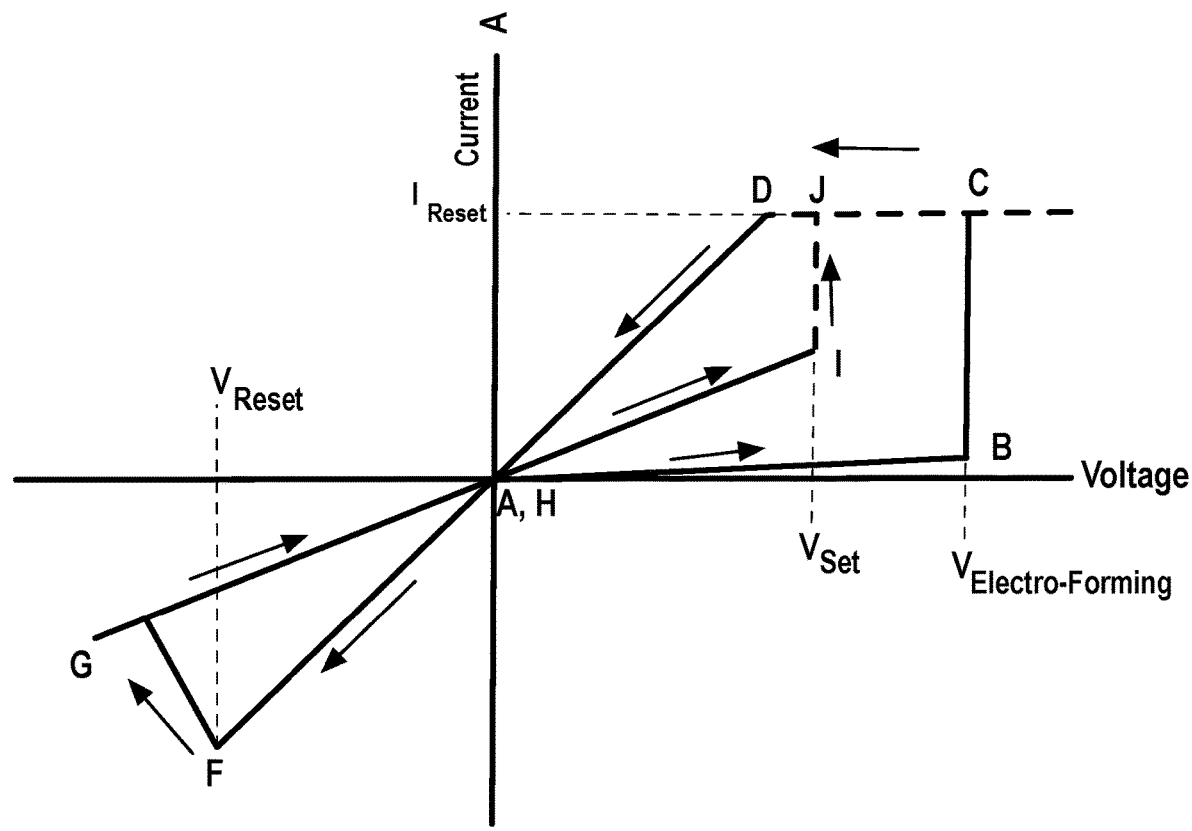
FIG. 5A illustrates an I-V plot, demonstrating concepts involved with filament formation and voltage cycling (reading and witting) in an RRAM device, in accordance with embodiments of the present disclosure.
Figures 5B, 5C:
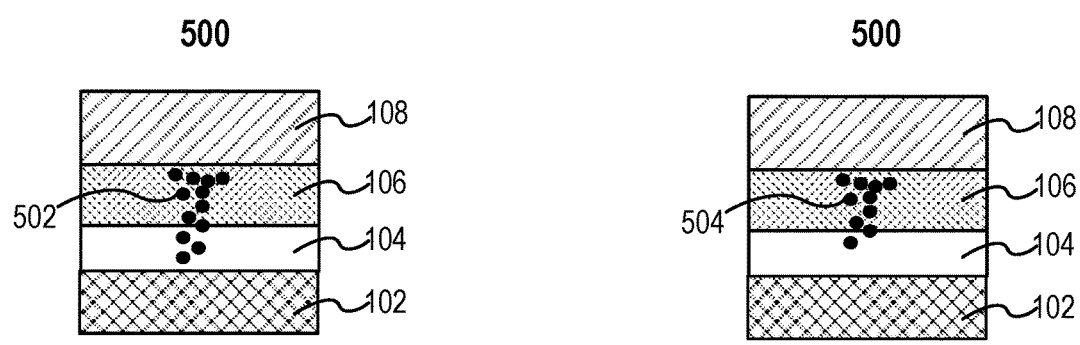
FIG. 5B illustrates a cross-sectional view of a conductive filament formed in an RRAM device, in an accordance with an embodiment of the present disclosure
FIG. 5C illustrates a cross-sectional view of an RRAM device where the conductive filament is broken, in an accordance with an embodiment of the present disclosure.

FIG. 5A illustrates an I-V plot, demonstrating concepts involved with filament formation and voltage cycling (reading and writing) in an RRAM device, such as an RRAM device 500 depicted in FIG. 5B, in accordance with embodiments of the present disclosure. RRAM device 500 is the same or substantially the same as the RRAM device 100A. The initial operation of the RRAM device 500 begins by applying a voltage, between the top electrode 108 and the bottom electrode 102, that increases in magnitude until it reaches a value $V_{Electro\text{-}Forming}$ (point A to B). In an embodiment, $V_{Electro\text{-}Forming}$ is less than 1.6V. In an "intentional" one-time breakdown process, known as electro-forming, oxygen vacancies, $V_o$, are removed from the oxygen exchange layer 106 into the switching layer 104 and into the switching layer 104 to augment the vacancies created during the anneal process described above. Movement of vacancies in response to an electric field generated in the RRAM device 500 leads to a formation of a "conductive filament" in the switching layer 104. In an embodiment, the conductive filament may extend across switching layer 104 (point B).

FIG. 5B depicts an illustration of a filament 502 in the RRAM device 500, in an accordance with an embodiment of the present disclosure. It is to be appreciated that a size of the filament 502 may be determined by resistance of the RRAM device before the process of electro-forming and by the electroforming voltage. With a conductive filament, bridging from the top electrode 108 to the bottom electrode 102, the RRAM device 500 is said to be almost immediately conductive. Referring again to the I-V plot, RRAM device 500 becomes conductive and the current through the RRAM device starts to increase (point B to C), until it reaches a predetermined compliance current, $I_{Comp}$. The current through the RRAM device 500 does not continue to increase beyond $I_{Comp}$. In an embodiment, when the RRAM device is coupled with a transistor, $I_{Comp}$ may be the maximum current that the transistor can deliver to the RRAM device 500. At point C, the RRAM device 500 is in a low resistance state.

By reducing the magnitude of the voltage (while maintaining a positive polarity) between the top electrode 108 and bottom electrode 102 (moving from point C to D and then to point A), causes a reduction in a strength of the electric field. By applying a voltage of an opposite polarity between the top electrode 108 and bottom electrode 102 (moving from point A to F), causes a reversal in a direction of the electric field. In response to the change in the direction of the electric field, the oxygen vacancies move towards the oxygen exchange layer 106, leading to a dissolution of the conductive filament 504 in the switching layer 104 and in the switching layer 104. Filament dissolution takes place at a critical voltage (point F), termed $V_{Reset}$. In an embodiment, $V_{Reset}$ is between −0.6 V and −1.1 V. Increasing the magnitude of the voltage beyond $V_{Reset}$ changes the current flowing through the device. With a dissolved filament 504, the current through the RRAM device 500 decreases dramatically and the device returns to a high resistance state (point G). FIG. 5C depicts an illustration of a dissolved filament 504 in the RRAM device 500, in an accordance with an embodiment of the present disclosure. Referring again to the I-V plot in FIG. 5A, it is to be appreciated that the high resistance level of the RRAM device, point G, is different and lower in magnitude compared to the resistance level of the device before the onset of the forming process. In other words, the resistance level of the RRAM device 500 in a high resistance state can be over 10 times smaller than the virgin resistance (discussed above). By decreasing the magnitude of the voltage, traversing from point G to H and then to point I in the I-V plot, the dissolved filament is recreated again (at point I) under the action of vacancy migration. At a critical voltage, $V_{Set}$, the filament completely bridges the top electrode 108 and the bottom electrode 102 and current begins to flow through the RRAM device. In an embodiment, $V_{Set}$ is less than 1.0 V. The RRAM device is, once again, said to be in a conductive or a low resistance state (at point J). The filament, that is recreated at point J, may have a size that is comparable to the size of the filament formed during the electro-forming process.

Cycling of an RRAM device 500 in this manner, where the resistance levels remain unchanged when the voltage between the top electrode 108 and the bottom electrode 102 is set to 0V, leads to non-volatile memory effect. By increasing the magnitude of the voltage to at least 0.05V, the resistance state of the RRAM device 500 can be read. In one example, a voltage of 0.05V to 0.2V, referred to as a read voltage, VR, is much less than the switching voltage ($V_{Set}$ or $V_{Reset}$) and does not perturb the resistance state of the RRAM device 500. It is to be appreciated that the values $V_{Set}$ and $V_{Reset}$ generally refer to a portion of a voltage that may be applied to a transistor in series with the RRAM device 500. The RRAM device 500 coupled with a transistor in this manner is given the term embedded memory.

Figure 6:
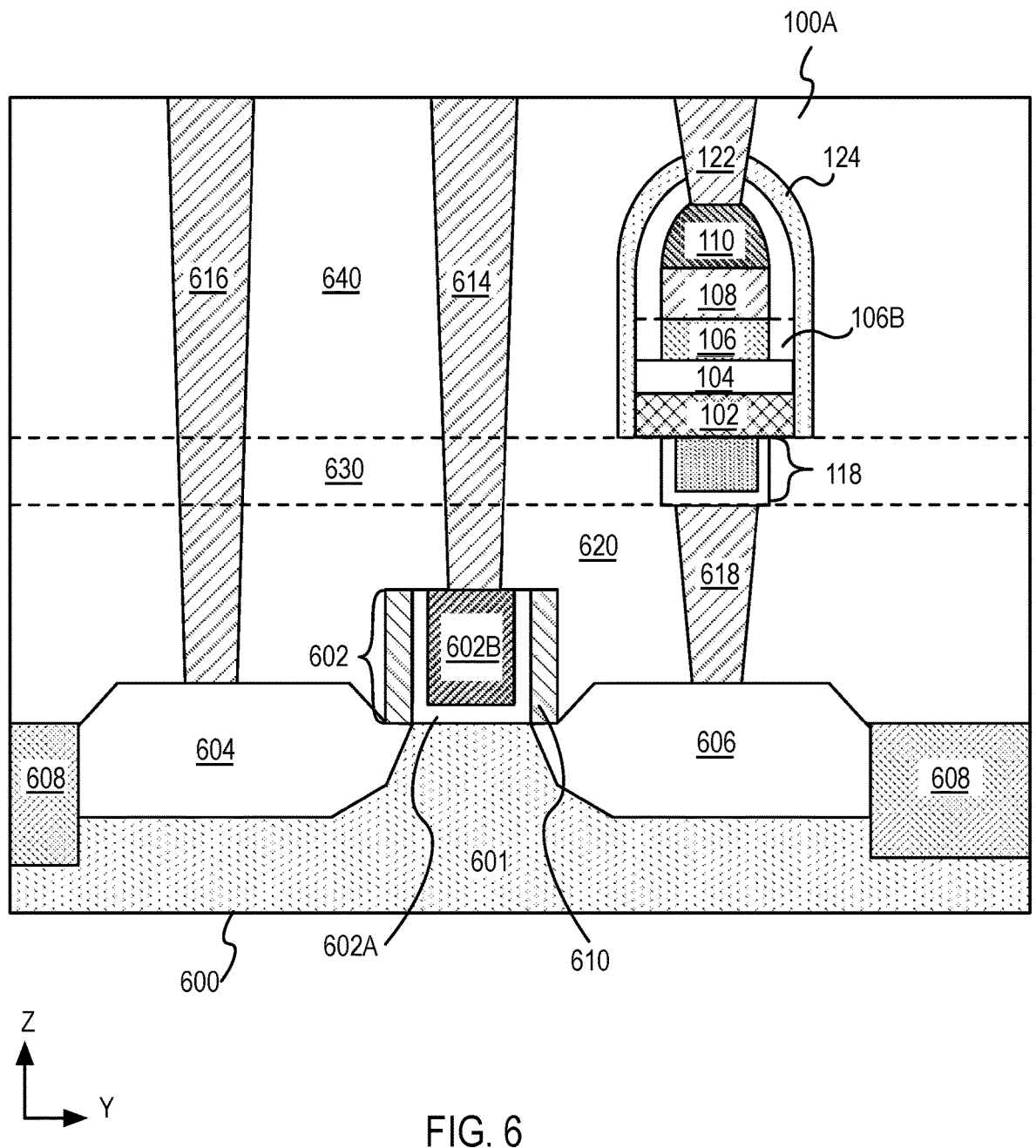
FIG. 6 illustrates a cross-sectional view of an RRAM element coupled to a drain side of a select transistor, in accordance with an embodiment of the present disclosure.

FIG. 6 illustrates a cross-sectional view of an RRAM device such as the RRAM device 100A formed above a metallization structure 118 coupled to an access transistor 600, in accordance with an embodiment. RRAM device 100A includes the bottom electrode 102, the switching layer 104, the oxygen exchange layer 106, the top electrode 108 and cap 110 and at least a sidewall oxide 106B.

In an embodiment, the metallization structure 118 is coupled to a drain contact structure 618. In an embodiment, contact structure 604 is above and electrically coupled with a drain region 606 of an access transistor 600 above a substrate 601. In an embodiment, the metallization structure 118 is in a via formed in a dielectric layer 630. In an embodiment, the metallization structure 118 is in a via formed in a dielectric layer 620.

In an embodiment, the underlying substrate 601 represents a surface used to manufacture integrated circuits. Suitable substrate 601 includes a material such as single crystal silicon, polycrystalline silicon and silicon on insulator (SOI), as well as similar substrates formed of other semiconductor materials. The substrate 601 may also include semiconductor materials, metals, dielectrics, dopants, and other materials commonly found in semiconductor substrates.

In an embodiment, the access transistor 600 associated with substrate 601 are metal-oxide-semiconductor field-effect transistors (MOSFET or simply MOS transistors), fabricated on the substrate 601. In various implementations of the disclosure, the access transistor 600 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 600 of substrate 601 includes a gate stack 602 formed of at least two layers, a gate dielectric layer 602A and a gate electrode 602B. The gate dielectric layer 602A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 602A to improve its quality when a high-k material is used.

The gate electrode 602B of the access transistor 600 of substrate 601 is formed on the gate dielectric layer 602A and may consist of at least one P-type work function metal or N-type work function metal, depending on whether the transistor is to be a PMOS or an NMOS transistor. In some implementations, the gate electrode 602B may consist of a stack of two or more metal layers, where one or more metal layers are work function metal layers and at least one metal layer is a conductive fill layer.

For a PMOS transistor, metals that may be used for the gate electrode 602B include, but are not limited to, ruthenium, palladium, platinum, cobalt, nickel, and conductive metal oxides, e.g., ruthenium oxide. A P-type metal layer will enable the formation of a PMOS gate electrode 602B with a work function that is between about 4.9 eV and about 4.2 eV. For an NMOS transistor, metals that may be used for the gate electrode 602B include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode 602B with a work function that is between about 3.9 eV and about 4.2 eV.

In some implementations, the gate electrode 602B may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 602B may simply be a planar layer that is substantially parallel to the top surface of the substrate and does not include sidewall portions substantially perpendicular to the top surface of the substrate. In further implementations of the disclosure, the gate electrode 602B may consist of a combination of U-shaped structures and planar, non-U-shaped structures. For example, the gate electrode 602B may consist of one or more U-shaped metal layers formed atop one or more planar, non-U-shaped layers.

In some implementations of the disclosure, a pair of sidewall spacers 616 may be formed on opposing sides of the gate stack that bracket the gate stack. The sidewall spacers 616 may be formed from a material such as silicon nitride, silicon oxide, silicon carbide, silicon nitride doped with carbon, and silicon oxynitride. In an alternate implementation, a plurality of spacer pairs may be used, for instance, two pairs, three pairs, or four pairs of sidewall spacers may be formed on opposing sides of the gate stack.

As shown, source region 604 and drain region 606 are within the substrate adjacent to the gate stack of each MOS transistor. The source region 604 and drain region 606 are generally formed using either an implantation/diffusion process or an etching/deposition process. In the former process, dopants such as boron, aluminum, antimony, phosphorous, or arsenic may be ion-implanted into the substrate to form the source region 604 and drain region 606. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 604 and drain region 606. In some implementations, the source region 604 and drain region 606 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 604 and drain region 606 may be formed using one or more alternate semiconductor materials such as germanium or a suitable group III-V compound. And in further embodiments, one or more layers of metal and/or metal alloys may be used to form the source region 604 and drain region 606.

In an embodiment, an metallization structure 122 is in a dielectric layer 640 above the metallization structure 118. In an embodiment, dielectric layer 640 includes a material that is the same or substantially the same as the dielectric layer 630.

A gate contact 614 is on the gate stack 602, as shown. In an embodiment, various portions of the gate contact 614 are in a via formed within the dielectric layers 620, 630 and 640. A source contact 616 is contact with the source region 604, as shown. In an embodiment, various portions of the source contact 616 are in a via formed within the dielectric layers 620, 630 and 640. The access transistor 600 further includes dielectric spacer 610 adjacent to the gate stack 602. In the illustrative embodiment, the access transistor 600 further includes isolation 608 adjacent to source region 604 and drain region 606.

Figure 7:
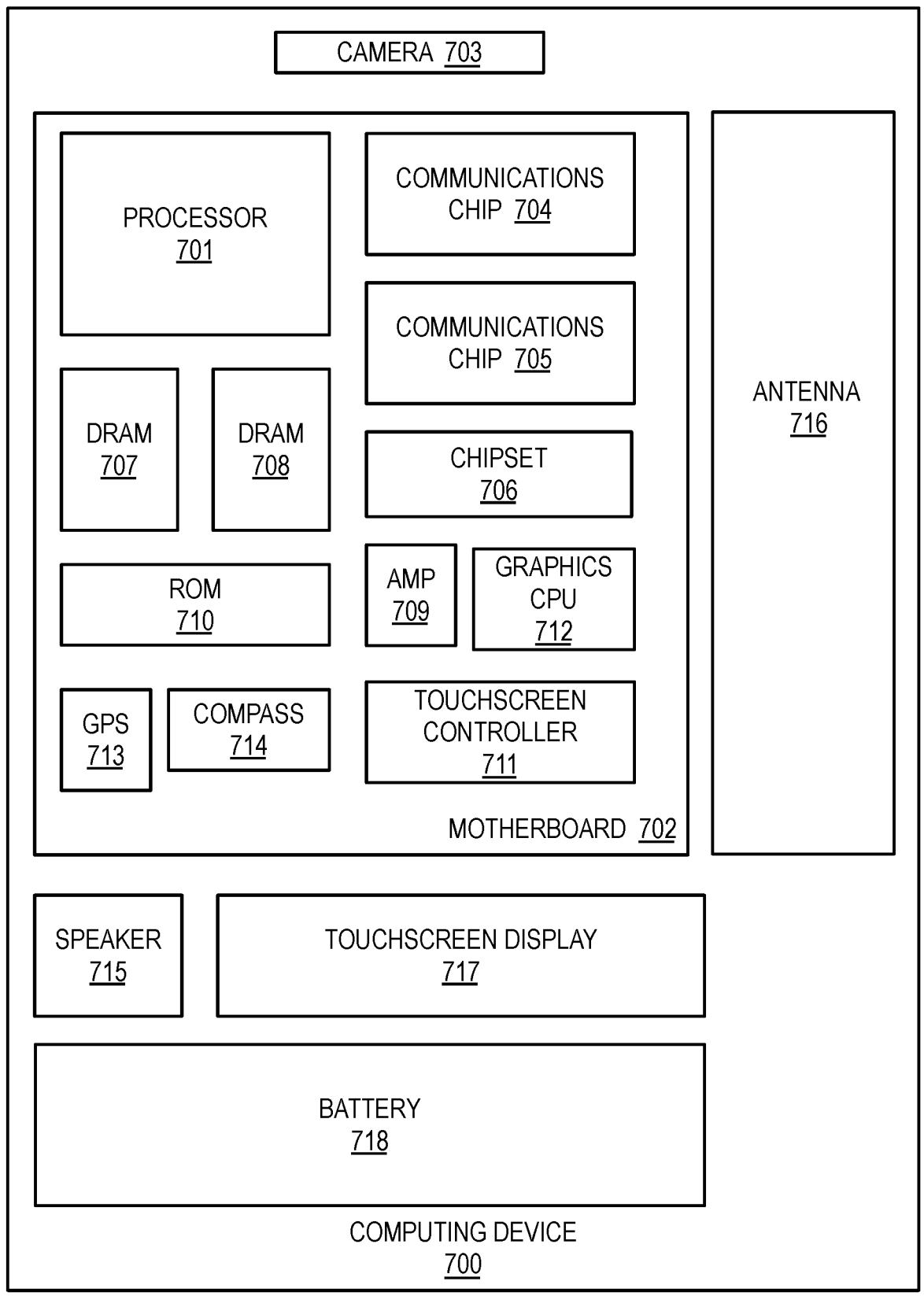
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 704 or 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communications chips 704 and 705. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes one or more memory devices, such as a RRAM device 100A, in accordance with embodiments of the present disclosure. The term "processor" may refer to any device or portion of a device that processes electronic data from registers and/or memory to transform that electronic data into other electronic data that may be stored in registers and/or memory.

Communications chip 705 also includes an integrated circuit die packaged within communication chip 705. In another embodiment, the integrated circuit die of communications chips 704, 705 include a RRAM device 100A.

Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of memory cells including one or more memory devices, such as a RRAM device 100A, built in accordance with embodiments of the present disclosure.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
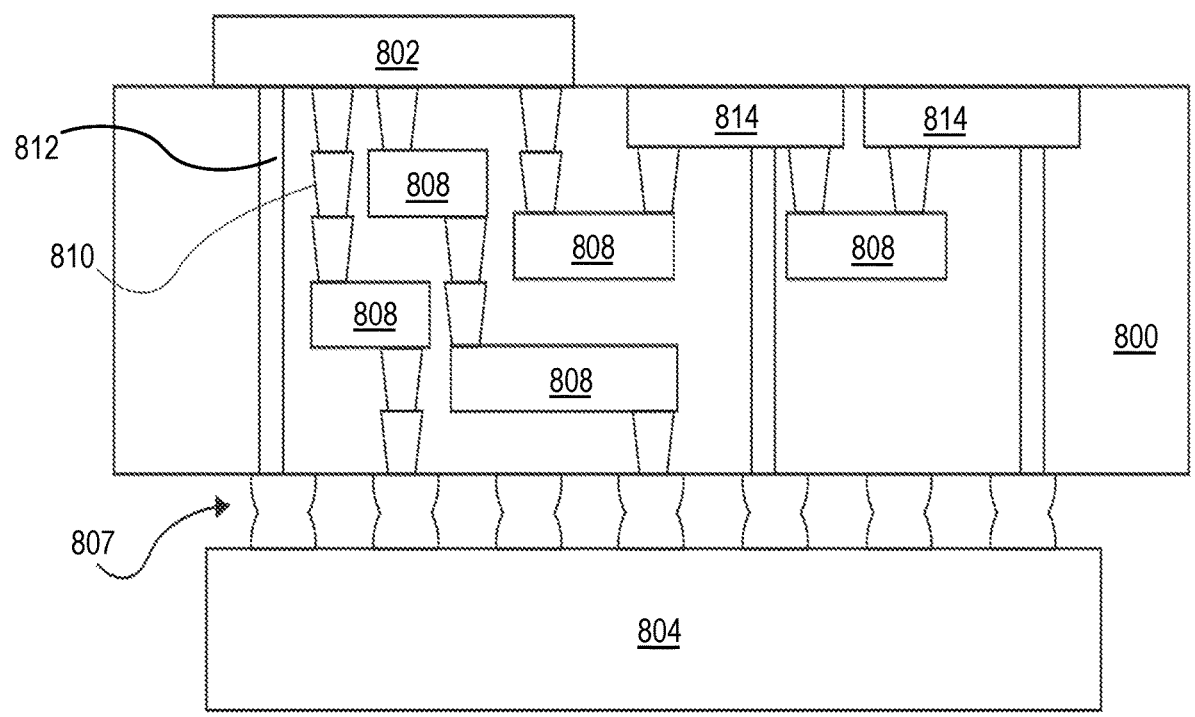
FIG. 8 illustrates an interposer that includes one or more embodiments of the disclosure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 808 and vias 810, including but not limited to through-silicon vias (TSVs) 812. The integrated circuit (IC) structure 800 may further include embedded devices 814, including both passive and active devices. Such devices include, but are not limited to, capacitors, decoupling capacitors, resistors, inductors, fuses, diodes, transformers, device structure including transistors, such as transistors 600 (described in FIG. 6) coupled with a with one at least one RRAM device 100A. In one embodiment, the RRAM device 100A includes the bottom electrode 102, the switching layer 104, the oxygen exchange layer 106, the top electrode 108 and cap 110 and at least a sidewall oxide 106B.

The integrated circuit (IC) structure 800 may further include embedded devices 814 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered. The resistive random-access memory (RRAM) device may be used in an embedded non-volatile memory application.

Thus, embodiments of the present disclosure include a for a resistive random-access memory (RRAM) device with a sidewall oxide and methods of fabrication. The following examples pertain to further embodiments.

In a first example, a memory device includes a first electrode, a second electrode, a switching layer between the first electrode and the second electrode, where the switching layer is to transition between first and second resistive states at a voltage threshold. The memory device further includes an oxygen exchange layer between the switching layer and the second electrode, where the oxygen exchange layer includes a metal and a sidewall oxide in contact with a sidewall of the oxygen exchange layer, and where the sidewall oxide includes the metal and oxygen, and where the sidewall oxide has a lateral thickness exceeding a thickness of the switching layer.

In second examples, for any of first examples, the lateral thickness is greater than 5 nm.

In third examples, for any of the first through second examples, the second electrode includes one or more metals. A sidewall oxide, including oxygen and the one or more metals, is in contact with a sidewall of the second electrode.

In fourth examples, for any of the first through third examples, the sidewall oxide in contact with the sidewall of the oxygen exchange layer has substantially the same lateral thickness as the sidewall oxide in contact with the sidewall of the second electrode.

In fifth examples, for any of the first through fourth examples, a first diameter of the memory device within a cross-sectional plane of the device includes a largest dimension of the oxygen exchange layer summed with twice the lateral thickness of the sidewall oxide. A second diameter of the memory device within the cross-sectional plane includes the largest diameter of the switching layer.

In sixth examples, for any of the first through fifth examples, the first electrode has a third diameter and the third diameter is larger than the first diameter, but smaller than the second diameter.

In seventh examples, for any of the first through sixth examples, the switching layer includes the metal and oxygen.

In eighth examples, for any of the first through seventh examples, the memory device structure further includes a capping layer above the second electrode, where the capping layer includes a metal and where a sidewall oxide is also in contact with a sidewall of the capping layer.

In ninth examples, for any of the first through eighth examples, the switching layer, the oxygen exchange layer and the second electrode include tantalum, the sidewall oxide in contact with a sidewall of the oxygen exchange layer includes tantalum and oxygen, the sidewall oxide in contact with a sidewall of the second electrode includes tantalum and oxygen and the device structure further includes a capping layer on the second electrode that includes tantalum.

In tenth examples, for any of the first through ninth examples, the first electrode includes ruthenium.

In eleventh examples, for any of the first through eighth examples, the memory device structure further includes a dielectric liner over the oxide sidewall and in contact with a sidewall of the switching layer, wherein the dielectric liner has a composition substantially free of the metal.

In twelfth examples, for any of the first through eleventh examples, the dielectric liner includes silicon and nitrogen.

In a thirteenth example, a method of fabricating a memory device structure includes depositing a first electrode layer and depositing a switching layer over the first electrode layer. The method further includes depositing an oxygen exchange layer over the switching layer and depositing a second electrode layer over the oxygen exchange layer. The method further includes forming a feature by patterning at least the second electrode layer, the oxygen exchange layer, and the switching layer and exposing a sidewall of the feature to a plasma oxidation process.

In fourteenth examples, for any of thirteenth example, the oxygen exchange layer includes a metal and exposing the sidewall of the feature converts a portion of the oxygen exchange layer into a sidewall oxide, where the sidewall oxide includes the metal and oxygen.

In fifteenth examples, for any of the thirteenth through fourteenth examples, patterning the feature damages a portion of the second electrode layer proximal to the feature sidewall, and exposing the sidewall to the plasma oxidation process converts the portion of second electrode layer damaged by the patterning into a sidewall oxide.

In sixteenth examples, for any of the thirteenth through fifteenth examples, patterning the feature damages a portion of the second electrode layer proximal to the feature sidewall, exposing the sidewall to the plasma oxidation process converts the portion of second electrode layer damaged by the patterning into a sidewall oxide.

In seventeenth examples, for any of the thirteenth through sixteenth examples, the method further includes patterning the first electrode layer with a mixture including oxygen to form a first electrode layer sidewall and patterning the first electrode layer increases a thickness of the sidewall oxide by converting a portion of the oxygen exchange layer adjacent to the sidewall oxide into a material of the sidewall oxide.

In eighteenth examples, for any of the seventeenth examples, patterning the first electrode layer further includes recessing the first electrode layer sidewall under the sidewall oxide.

In a nineteenth example, a system includes a processor and a memory coupled to the processor. The memory includes an array of memory devices, where individual ones of the memory devices further include a first electrode, a second electrode, a switching layer between the first electrode and the second electrode, where the switching layer is to transition between first and second resistive states at a voltage threshold. The memory device further includes an oxygen exchange layer between the switching layer and the second electrode, where the oxygen exchange layer includes a metal and a sidewall oxide in contact with a sidewall of the oxygen exchange layer, where the sidewall oxide includes the metal and oxygen, and where the sidewall oxide has a lateral thickness exceeding a thickness of the switching layer.

In twentieth examples, for any of the nineteenth example, the system further includes a battery coupled to power at least one of the processor or memory.

What is claimed is:

1. A memory device structure, comprising:
    a first electrode;
    a second electrode;
    a switching layer between the first and second electrodes, wherein the switching layer is to transition between first and second resistive states;
    an oxygen exchange layer between the switching layer and the second electrode, wherein the oxygen exchange layer comprises tantalum; and a sidewall structure in contact with a sidewall of the oxygen exchange layer, wherein the sidewall structure comprises tantalum and oxygen.

2. The memory device structure of claim 1, wherein the sidewall structure has a lateral thickness exceeding a vertical thickness of the switching layer.

3. The memory device structure of claim 1, wherein:
a first diameter of the memory device structure within a cross-sectional plane of the memory device structure comprises a largest dimension of the oxygen exchange layer summed with twice the lateral thickness of the sidewall structure; and
a second diameter of the memory device structure within the cross-sectional plane comprises a largest diameter of the switching layer.

4. The memory device structure of claim 3, wherein:
the first electrode has a third diameter; and
the third diameter is larger than the first diameter, but smaller than the second diameter.

5. The memory device structure of claim 1, wherein the switching layer comprises tantalum.

6. The memory device structure of claim 5, wherein the second electrode comprises tantalum, wherein a second sidewall structure in contact with a sidewall of the second electrode comprises tantalum and oxygen, and wherein the memory device structure further comprises a capping layer comprising tantalum on the second electrode.

7. The memory device structure of claim 1, wherein the first electrode comprises ruthenium.

8. The memory device structure of claim 7, further comprising:
a processor; and
a memory coupled to the processor, the memory comprising the first electrode, the second electrode, the switching layer, the oxygen exchange layer, and the sidewall structure.

9. A memory device structure, comprising:
a first electrode;
a second electrode comprising one or more metals;
a switching layer between the first and second electrodes, wherein the switching layer is to transition between first and second resistive states;
an oxygen exchange layer between the switching layer and the second electrode, wherein the oxygen exchange layer comprises a metal;
a first sidewall structure in contact with a sidewall of the oxygen exchange layer, wherein the first sidewall structure comprises oxygen and the metal of the oxygen exchange layer; and
a second sidewall structure in contact with a sidewall of the second electrode, wherein the second sidewall structure comprises oxygen and the one or more metals of the second electrode.

10. The memory device structure of claim 9, wherein the first sidewall structure has a lateral thickness exceeding a vertical thickness of the switching layer.

11. The memory device structure of claim 9, wherein a first lateral thickness of the first sidewall structure is substantially the same as a second lateral thickness of the second sidewall structure.

12. The memory device structure of claim 9, further comprising:
a processor; and
a memory coupled to the processor, the memory comprising the first electrode, the second electrode, the switching layer, the oxygen exchange layer, and the first and second sidewall structures.

13. A memory device structure, comprising:
a first electrode;
a second electrode comprising one or more metals;
a switching layer between the first and second electrodes, wherein the switching layer is to transition between first and second resistive states;
an oxygen exchange layer between the switching layer and the second electrode, wherein the oxygen exchange layer comprises a metal;
a first sidewall structure in contact with a sidewall of the oxygen exchange layer, wherein the first sidewall structure comprises the metal and oxygen; and
a capping layer above the second electrode, wherein the capping layer comprises the metal or a second metal, and wherein a second sidewall structure is in contact with a sidewall of the capping layer.

14. The memory device structure of claim 13, wherein the first sidewall structure has a lateral thickness exceeding a vertical thickness of the switching layer.

15. The memory device structure of claim 13, wherein the second sidewall structure comprises the metal or the second metal and oxygen.

16. The memory device structure of claim 13, further comprising:
a processor; and
a memory coupled to the processor, the memory comprising the first electrode, the second electrode, the switching layer, the oxygen exchange layer, the capping layer, and the first and second sidewall structures.

17. A memory device structure, comprising:
a first electrode;
a second electrode comprising one or more metals;
a switching layer between the first and second electrodes, wherein the switching layer is to transition between first and second resistive states;
an oxygen exchange layer between the switching layer and the second electrode, wherein the oxygen exchange layer comprises a metal;
a sidewall structure in contact with a sidewall of the oxygen exchange layer, wherein the sidewall structure comprises the metal and oxygen; and
a dielectric liner over the sidewall structure and in contact with a sidewall of the switching layer, wherein the dielectric liner has a composition substantially free of the metal.

18. The memory device structure of claim 17, wherein the sidewall structure has a lateral thickness exceeding a vertical thickness of the switching layer.

19. The memory device structure of claim 17, wherein the dielectric liner comprises silicon and nitrogen.

20. The memory device structure of claim 17, further comprising:
a processor; and
a memory coupled to the processor, the memory comprising the first electrode, the second electrode, the switching layer, the oxygen exchange layer, the sidewall structure, and the dielectric liner.

* * * * *